(12) United States Patent
Li et al.

(10) Patent No.: US 12,402,461 B2
(45) Date of Patent: *Aug. 26, 2025

(54) SYSTEMS AND METHODS FOR COAXIAL MULTI-COLOR LED

(71) Applicant: Jade Bird Display (Shanghai) Limited, Shanghai (CN)

(72) Inventors: Qiming Li, Albuquerque, NM (US); Qunchao Xu, Shanghai (CN)

(73) Assignee: JADE BIRD DISPLAY (SHANGHAI) LIMITED, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/593,871

(22) Filed: Mar. 2, 2024

(65) Prior Publication Data
US 2024/0250111 A1    Jul. 25, 2024

Related U.S. Application Data

(63) Continuation of application No. 17/989,624, filed on Nov. 17, 2022, now Pat. No. 11,955,505, which is a
(Continued)

(51) Int. Cl.
*H10H 29/10*    (2025.01)
*H01L 25/075*   (2006.01)
(Continued)

(52) U.S. Cl.
CPC ......... *H10H 29/10* (2025.01); *H01L 25/0753* (2013.01); *H10D 86/40* (2025.01);
(Continued)

(58) Field of Classification Search
CPC .......... H10H 20/8314; H10H 20/8131; H10H 20/813; H10H 29/962
See application file for complete search history.

(56) References Cited

U.S. PATENT DOCUMENTS 7,982,228 B2    7/2011  Choi et al.
10,325,894 B1   6/2019  Pan
(Continued)

FOREIGN PATENT DOCUMENTS

CN    102171847 A    8/2011
CN    110709995 A    1/2020
(Continued)

OTHER PUBLICATIONS

Office Action issued in Taiwanese Patent Application No. 109146097 dated Apr. 30, 2024.
(Continued)

*Primary Examiner* — Alia Sabur
(74) *Attorney, Agent, or Firm* — Morgan, Lewis & Bockius LLP

(57) ABSTRACT

A micro multi-color LED device includes two or more LED structures for emitting a range of colors. The two or more LED structures are vertically stacked to combine light from the two more LED structures. In some embodiments, each LED structure is connected to a pixel driver and a shared P-electrode. The LED structures are bonded together through bonding layers. In some embodiments, reflection layers are implemented in the device to improve the LED emission efficiency. A display panel comprising an array of the micro tri-color LED devices has a high resolution and a high illumination brightness.

18 Claims, 6 Drawing Sheets

Related U.S. Application Data continuation of application No. 16/904,841, filed on Jun. 18, 2020, now Pat. No. 11,538,850.

(60) Provisional application No. 62/863,559, filed on Jun. 19, 2019.

(51) Int. Cl.
  *H10D 86/40* (2025.01)
  *H10D 86/60* (2025.01)
  *H10H 20/01* (2025.01)
  *H10H 20/856* (2025.01)
  *H10H 20/857* (2025.01)

(52) U.S. Cl.
  CPC .......... *H10D 86/60* (2025.01); *H10H 20/856* (2025.01); *H10H 20/857* (2025.01); *H10H 20/0364* (2025.01)

(56) References Cited

U.S. PATENT DOCUMENTS

| | | | |
|---|---|---|---|
| 11,538,850 B2 * | 12/2022 | Li | H10H 20/856 |
| 11,955,505 B2 * | 4/2024 | Li | H01L 25/167 |
| 2005/0022697 A1 | 2/2005 | Benrashid et al. | |
| 2006/0001973 A1 | 1/2006 | Peterson et al. | |
| 2007/0170444 A1 | 7/2007 | Cao | |
| 2010/0213485 A1 | 8/2010 | McKenzie et al. | |
| 2013/0250567 A1 | 9/2013 | Edmond et al. | |
| 2014/0159064 A1 | 6/2014 | Sakariya et al. | |
| 2014/0191246 A1 | 7/2014 | Oraw | |
| 2017/0338275 A1 | 11/2017 | Banna et al. | |
| 2017/0358562 A1 | 12/2017 | Banna et al. | |
| 2018/0090058 A1 | 3/2018 | Chen et al. | |
| 2018/0132330 A1 | 5/2018 | Chong et al. | |
| 2018/0166429 A1 | 6/2018 | Chong et al. | |
| 2018/0190712 A1 | 7/2018 | Xu et al. | |
| 2019/0066571 A1 | 2/2019 | Goward | |
| 2019/0164945 A1 | 5/2019 | Chae et al. | |
| 2019/0165038 A1 * | 5/2019 | Chae | H01L 25/0756 |
| 2019/0165207 A1 * | 5/2019 | Kim | H10H 20/8514 |
| 2019/0165503 A1 | 5/2019 | Geng et al. | |
| 2019/0189596 A1 | 6/2019 | Chae et al. | |
| 2019/0206927 A1 | 7/2019 | Lee et al. | |
| 2020/0212262 A1 * | 7/2020 | Jang | H01L 25/0756 |

FOREIGN PATENT DOCUMENTS

| | | |
|---|---|---|
| CN | 110828435 A | 2/2020 |
| JP | H06-013655 A | 1/1994 |
| JP | H06-13655 A | 1/1994 |
| TW | 201828517 A | 8/2018 |
| TW | 201916342 A | 4/2019 |
| TW | 202006695 A | 2/2020 |
| WO | 2017/037529 A1 | 3/2017 |
| WO | 2018175338 A1 | 9/2018 |

OTHER PUBLICATIONS

Notice of Reasons for Refusal issued in Japanese Patent Application No. 2021-573780 drafted Jul. 2, 2024.

Office Action issued in Chinese Patent Application No. 202080044771.4 dated Jul. 31, 2024.

The International Searching Authority, the International Search Report and the Written Opinion, PCT/US2020/038337, Hong Kong Beida Jade Bird Display Limited, Oct. 5, 2020, 9 pages.

The International Searching Authority, the International Search Report and the Written Opinion, PCT/US2020/038785, Hong Kong Beida Jade Bird Display Limited, Sep. 14, 2020, 30 pages.

Extended European Search Report dated Jun. 14, 2023, issued in corresponding European Patent Application No. 20825423.5.

Extended European Search Report dated Sep. 6, 2023, issued in corresponding European Patent Application No. 20827064.5.

Hong Kong Beida Jade Bird Display Limited, International Preliminary Report on Patentability, PCT/US2020/038337, dated Dec. 21, 2021, 7 pages.

Hong Kong Beida Jade Bird Display Limited, Office Action (JPOA1) dated Jan. 26, 2024, issued in corresponding Japanese Patent Application No. 2021-573780.

Hong Kong Beida Jade Bird Display Limited, Request for the Submission of an Opinion in Korean Patent Application No. 1020227001828, dated Feb. 18, 2025, 18 pgs.

Hong Kong Beida Jade Bird Display Limited, Extended European Search Report in European Patent Application No. 24206108.3, dated Feb. 3, 2025, 10 pgs.

Hong Kong Beida Jade Bird Display Limited, Extended European Search Report in European Patent Application No. 24206106.7, dated Feb. 3, 2025, 10 pgs.

Hong Kong Beida Jade Bird Display Limited, Extended European Search Report in European Patent Application No. 24203353.8, dated Feb. 14, 2025, 9 pgs.

Hong Kong Beida Jade Bird Display Limited, Non-Final Office Action in Taiwan Patent Application No. 113139265, dated Nov. 25, 2024, 10 pgs.

Hong Kong Beida Jade Bird Display Limited, Second Office Action in Chinese Patent Application No. 202080044771.4, dated Dec. 6, 2024, 33 pgs.

* cited by examiner

SYSTEMS AND METHODS FOR COAXIAL MULTI-COLOR LED

RELATED APPLICATIONS

This application is a continuation application of U.S. patent application Ser. No. 17/989,624, filed on Nov. 17, 2022, which is a continuation application of U.S. patent application Ser. No. 16/904,841, filed on Jun. 18, 2020, which claims priority to U.S. Provisional Application No. 62/863,559, filed on Jun. 19, 2019. The contents of the above patent applications are incorporated herein in their entirety by reference.

TECHNICAL FIELD

The present disclosure relates generally to light-emitting diode (LED) display devices, and more particularly, to systems and fabricating methods for LED semiconductor devices that emit different colors with high brightness and micro-meter scale pixel size.

BACKGROUND

With the development of Mini LED and Micro LED technology in recent years, consumer devices and applications such as augmented reality (AR), projection, heads-up display (HUD), mobile device displays, wearable device displays, and automotive displays, require LED panels with improved resolution and brightness. For example, an AR display integrated within a goggle and positioned close to a wearer's eyes can have a dimension of a fingernail while still demanding an HD definition (1280×720 pixels) or higher. Many electronic devices require certain pixel size, distance between adjacent pixels, brightness, and viewing angle for the LED panels. Often, when trying to achieve the maximum resolution and brightness on a small display, it is challenging to maintain both the resolution and brightness requirements. In contrast, in some cases, pixel size and brightness are difficult to balance at the same time as they can have an approximately opposite relationship. For example, getting a high brightness for each pixel could result in a low resolution. Alternatively, obtaining a high resolution could bring the brightness down.

Generally, at least red, green and blue colors are superimposed to reproduce a broad array of colors. In some instances, to include at least red, green and blue colors within a pixel area, separate monochromatic LEDs are fabricated at different non-overlapping zones within the pixel area. The existing technology faces challenges to improve the effective illumination area within each pixel when the distance between the adjacent LEDs is determined. On the other hand, when a single LED illumination area is determined, further improving the overall resolution of the LED panel can be a difficult task because LEDs with different colors have to occupy their designated zones within the single pixel.

Active matrix liquid-crystal displays (LCD) and organic light emitting diode (OLED) displays combined with thin-film transistor (TFT) technology are becoming increasingly popular in today's commercial electronic devices. These displays are widely used in laptop personal computers, smartphones and personal digital assistants. Millions of pixels together create an image on a display. The TFTs act as switches to individually turn each pixel on and off, rendering the pixel light or dark, which allows for convenient and efficient control of each pixel and of the entire display.

However, conventional LCD displays suffer from low light efficiency, causing high power consumption and limited battery operation time. While active-matrix organic light-emitting diode (AMOLED) display panels generally consume less power than LCD panels, an AMOLED display panel can still be the dominant power consumer in battery-operated devices. To extend battery life, it is desirable to reduce the power consumption of the display panel.

Conventional inorganic semiconductor light emitting diodes (LED) have demonstrated superior light efficiency, which makes active matrix LED displays more desirable for battery operated electronics. Arrays of driver circuitry and lighting-emitting diodes (LEDs) are used to control millions of pixels, rendering images on the display. Both single-color display panels and full-color display panels can be manufactured according to a variety of fabrication methods.

However, the integration of thousands or even millions of micro LEDs with pixel driver circuit array is quite challenging. Various fabrication methods have been proposed. In one approach, control circuitry is fabricated on one substrate and LEDs are fabricated on a separate substrate. The LEDs are transferred to an intermediate substrate and the original substrate is removed. Then the LEDs on the intermediate substrate are picked and placed one or a few at a time onto the substrate with the control circuitry. However, this fabrication process is inefficient, costly and not reliable. In addition, there are no existing manufacturing tools for mass transferring micro LEDs. Therefore new tools must be developed.

In another approach, the entire LED array with its original substrate is aligned and bonded to the control circuitry using metal bonding. The substrate on which the LEDs are fabricated remains in the final product, which may cause light cross-talk. Additionally, the thermal mismatch between the two different substrates generates stress at the bonding interface, which can cause reliability issues. Furthermore, multi-color display panels typically require more LEDs and different color LEDs grown on different substrate materials, compared with single-color display panels, thus making the traditional manufacturing process even more complicated and inefficient.

As such, it would be desirable to provide an LED structure for display panels that addresses the above-mentioned drawbacks, amongst others.

SUMMARY

There is a need for improved multi-color LED designs that improve upon, and help to address the shortcomings of conventional display systems, such as those described above. In particular, there is a need for an LED device structure that can improve the brightness and resolution at the same time while efficiently maintaining low power consumption. The multi-color LED device described herein integrates at least three micro-LED structures vertically stacked by placing them at different layers of the device structure and utilizing one of the same electrode for receiving control currents. By placing at least three LED structures aligned along one axis as disclosed herein, the system effectively enhances the light illumination efficiency within a single pixel area, and at the same time, improves the resolution of the LED panel.

Pitch refers to the distance between the centers of adjacent pixels on a display panel. In some embodiments, the pitch can vary from about 40 microns, to about 20 microns, to about 10 microns, and/or preferably to about 5 microns or below. Many efforts have been made to reduce the pitch. A single pixel area is fixed when the pitch specification is determined.

The multi-color coaxial LED system described herein makes it possible to emit light with a combination of different colors from a single pixel area without using extra area to accommodate LED structures with different colors. Therefore, the footprint of a single pixel is significantly reduced and the resolution of the micro-LED panel can be improved. While the concentration of the different-colored light from one micro-LED device boundary greatly enhances the brightness within a single pixel area.

Compared to conventional fabrication processes for micro-LED display chips, which rely on inefficient pick and place processes or unreliable multiple substrates approaches, the multi-color micro-LED fabrication processes disclosed herein effectively increases the efficiency and reliability of the micro-LED device fabrication. For example, the LED structures can be directly bonded on the substrate with the pixel drivers without introducing an intermediate substrate. In addition, no substrate for the micro-LED structures remain in the final multi-color device so that cross-talk and mismatch can be reduced.

The multi-color micro-LED devices described herein can improve brightness and resolution at the same time and are suitable for modern display panels, especially for high definition AR devices and virtual reality (VR) glasses.

In one embodiment, a single pixel multi-color micro light emitting diode (LED) device for a display panel includes: a substrate; two or more LED structure layers that include: a first LED structure layer stacked on top of the substrate; and a second LED structure layer stacked on top of the first LED structure layer. In some instances, the first LED structure layer, and the second LED structure layer substantially overlap laterally with one another to form a light path that combines light emitted from the first LED structure layer, and the second LED structure layer.

In some embodiments, the two or more LED structure layers of the single pixel multi-color micro-LED device further include: a third LED structure layer stacked on top of the second LED structure layer. In some instances, the third LED structure layer substantially overlaps laterally with the first LED structure layer, and the second LED structure layer to form the light path that additionally combines light emitted from the third LED structure layer.

In some embodiments, the single pixel multi-color micro-LED device further includes: a first bonding layer between the substrate and the first LED structure layer; a second bonding layer between the first LED structure layer and the second LED structure layer; and a third bonding layer between the second LED structure layer and the third LED structure layer.

In some embodiments of the single pixel multi-color micro-LED device, the first bonding layer is about 0.1 micron to about 3 microns, the second bonding layer is about 0.1 micron to about 5 microns, and the third bonding layer is about 0.1 micron to about 5 microns. In some embodiments, the second and third bonding layers are transparent.

In some embodiments, the substrate of the single pixel multi-color micro-LED device supports a pixel driver and the each of the first, second and third LED structure layers is electrically connected to the pixel driver.

In some embodiments, the pixel driver comprises a thin-film transistor pixel driver or a silicon CMOS pixel driver.

In some embodiments, the single pixel multi-color micro-LED device further includes: a first reflection layer between the substrate and the first LED structure layer; a second reflection layer between the first LED structure layer and the second LED structure layer; and a third reflection layer between the second LED structure layer and the third LED structure layer.

In some embodiments of the single pixel multi-color micro-LED device, at least one of the first, the second and the third reflection layers comprises a distributed Bragg reflector (DBR) structure; and each of the first, the second and the third reflection layers is about 0.1 micron to about 5 microns.

In some embodiments of the single pixel multi-color micro-LED device, first light emitted from the first LED structure layer propagates through the second LED structure layer and the third LED structure layer, and second light emitted from the second LED structure layer propagates through the third LED structure layer.

In some embodiments of the single pixel multi-color micro-LED device, each of the first, second and third LED structure layers include: an epitaxial structure forming an LED within the respective LED structure layer; a lower conductive layer electrically connected to a bottom of the LED; and an upper conductive layer electrically connected to a top of the LED. In some instances, the lower conductive layer is also electrically connected to the pixel driver and the upper conductive layer is also electrically connected to a common electrode.

In some embodiments of the single pixel multi-color micro-LED device, the epitaxial structure of each of the first, second and third LED structure layers is selected from one or more structures from the group consisting of a III-V nitride epitaxial structure, a III-V arsenide epitaxial structure, a III-V phosphide epitaxial structure, and a III-V antimonide epitaxial structure.

In some embodiments of the single pixel multi-color micro-LED device, the lower conductive layer and the upper conductive layer for each of the first, second and third LED structure layers comprise Indium Tin Oxide (ITO) layers, and each of the ITO layers is about 0.01 micron to 1 micron.

In some embodiments, the single pixel multi-color micro-LED device further includes: an anode metal contact pad electrically connected to the lower conductive layer of each of the first, second and third LED structure layers; a first cathode metal contact pad electrically connected to the upper conductive layer of the first LED structure layer; a second cathode metal contact pad electrically connected to the upper conductive layer of the second LED structure layer; and a third cathode metal contact pad electrically connected to the upper conductive layer of the third LED structure layer.

In some embodiments of the single pixel multi-color micro-LED device, the anode and cathode metal contact pads comprise one or more metals selected from the group consisting of aluminum, silver, rhodium, zinc, gold, germanium, nickel, chromium, platinum, tin, copper, tungsten, indium-tin-oxide, palladium, indium, and titanium.

In some embodiments of the single pixel multi-color micro-LED device, the epitaxial structure of each of the first, second and third LED structure layers is about 0.3 micron to about 5 microns.

In some embodiments of the single pixel multi-color micro-LED device, the LEDs of different LED structure layers produce light of different wavelengths.

In some embodiments of the single pixel multi-color micro-LED device, the LEDs of different LED structure layers produce light of different visible wavelengths.

In some embodiments of the single pixel multi-color micro-LED device, the LEDs of different LED structure layers are ultraviolet, blue, green, orange, red, or infrared micro LEDs.

In some embodiments of the single pixel multi-color micro-LED device, the first LED structure layer forms a red light LED; the second LED structure layer forms a green light LED; and the third LED structure layer forms a blue light LED.

In some embodiments of the single pixel multi-color micro-LED device, the longest dimension of the single pixel multi-color micro-LED device is about 1 micron to about 500 microns.

In some embodiments of the single pixel multi-color micro-LED device, the single pixel multi-color micro-LED device has a cross-sectional shape of a pyramid that has a bottom layer with the longest lateral dimension and the top layer with the shortest lateral dimension.

In some embodiments of the single pixel multi-color micro-LED device, the single pixel multi-color micro-LED device has an external quantum efficiency of no less than 20%.

In another embodiment, a micro-LED display chip includes: a substrate supporting an array of pixel drivers; and an array of single pixel multi-color micro light-emitting diode (LED) devices, and each single pixel multi-color LED device includes two or more LED structure layers stacked on top of the substrate and pixel drivers, with a bonding layer between adjacent LED structure layers, each of the LED structure layers further comprising an epitaxial structure forming a micro LED configured to produce a single color light. In some instances, the array of single pixel multi-color LEDs are electrically connected to the array of pixel drivers and common electrodes, the two or more LED structure layers overlap laterally with one another to form a light propagation path through the micro LEDs directly stacked together, and the micro LEDs of different LED structure layers produce light of different wavelengths.

In some embodiments of the micro-LED display chip, the common electrodes include a separate common electrode structure for all the micro LEDs within the same LED structure layer that produce the same color.

In yet another embodiment, a method for fabricating a single pixel tri-color micro light-emitting diode (LED) device for a display panel includes: providing a substrate, fabricating a first LED structure layer stacked on top of the substrate; fabricating a second LED structure layer stacked on top of the first LED structure layer; and fabricating a third LED structure layer stacked on top of the second LED structure layer. In some instances, the first LED structure layer, the second LED structure layer, and the third LED structure layer substantially overlap laterally with one another to form a light path that combines light emitted from the first LED structure layer, the second LED structure layer and the third LED structure layer.

In some embodiments, the method for fabricating the single pixel tri-color micro-LED device further includes: bonding the substrate and the first LED structure layer together by a first bonding layer; bonding the first LED structure layer and the second LED structure layer together by a second bonding layer; and bonding the second LED structure layer and the third LED structure layer together by a third bonding layer.

In some embodiments of the method for fabricating the single pixel tri-color micro-LED device, the first bonding layer includes one or more bonding structures selected from the group consisting of Au—Au bonding, Au—Sn bonding, Au—In bonding, Ti—Ti bonding, and Cu—Cu bonding.

In some embodiments of the method for fabricating the single pixel tri-color micro-LED device, each of the second bonding layer and the third bonding layer includes one or more bonding materials selected from the group consisting of transparent plastic (resin), SiO2, spin-on glass (SOG), and bonding adhesive Micro Resist BCL-1200.

In some embodiments of the method for fabricating the single pixel tri-color micro-LED device, the first bonding layer is about 0.1 micron to about 3 microns, the second bonding layer is about 0.1 micron to about 5 microns, and the third bonding layer is about 0.1 micron to about 5 microns. In some instances, the second and third bonding layers are transparent.

In some embodiments, the method for fabricating the single pixel tri-color micro-LED device further includes: coating a first reflection layer on the first LED structure layer before the bonding of the substrate and the first LED structure layer; coating a second reflection layer on the first LED structure layer before the bonding of the first LED structure layer and the second LED structure layer; and coating a third reflection layer on the second LED structure layer before the bonding of the second LED structure layer and the third LED structure layer.

In some embodiments, the method for fabricating the single pixel tri-color micro-LED device, further includes: forming a distributed Bragg reflector (DBR) structure for each of the first, the second and the third reflection layers. In some embodiments, each of the first, the second and the third reflection layers is about 0.1 micron to about 5 microns.

In some embodiments of the method for fabricating the single pixel tri-color micro-LED device, the substrate supports a pixel driver and the each of the first, second and third LED structure layers is electrically connected to the pixel driver.

In some embodiments, the method for fabricating the single pixel tri-color micro-LED device, further includes: for each of the first, second and third LED structure layers comprising an epitaxial structure: patterning the epitaxial structure to form an LED within the respective LED structure layer; coating a lower conductive layer to electrically connect to a bottom of the LED; and coating an upper conductive layer to electrically connect to a top of the LED. In some instances, the lower conductive layer is also electrically connected to the pixel driver and the upper conductive layer is also electrically connected to a common electrode.

In some embodiments of the method for fabricating the single pixel tri-color micro-LED device, the epitaxial structure of each of the first, second and third LED structure layers is selected from one or more structures from the group consisting of a III-V nitride epitaxial structure, a III-V arsenide epitaxial structure, a III-V phosphide epitaxial structure, and a III-V antimonide epitaxial structure.

In some embodiments of the method for fabricating the single pixel tri-color micro-LED device: the lower conductive layer and the upper conductive layer for each of the first, second and third LED structure layers comprise Indium Tin Oxide (ITO) layers, and each of the ITO layers are about 0.01 micron to 1 micron.

In some embodiments, the method for fabricating the single pixel tri-color micro-LED device, further includes: coating an anode metal contact pad to electrically connect to the lower conductive layer of each of the first, second and third LED structure layers; coating a first cathode metal contact pad to electrically connect to the upper conductive layer of the first LED structure layer; coating a second cathode metal contact pad to electrically connect to the upper conductive layer of the second LED structure layer; and coating a third cathode metal contact pad to electrically connect to the upper conductive layer of the third LED structure layer.

In some embodiments of the method for fabricating the single pixel tri-color micro-LED device, the epitaxial structure of each of the first, second and third LED structure layers is about 0.3 micron to about 5 microns.

In some embodiments of the method for fabricating the single pixel tri-color micro-LED device, the LEDs of different LED structure layers produce light of different wavelengths.

In some embodiments of the method for fabricating the single pixel tri-color micro-LED device, the LEDs of different LED structure layers produce light of different visible wavelengths.

In some embodiments of the method for fabricating the single pixel tri-color micro-LED device, the LEDs of different LED structure layers are ultraviolet, blue, green, orange, red, or infrared micro LEDs.

In some embodiments, the method for fabricating the single pixel tri-color micro-LED device further includes: patterning the first LED structure layer to form a red light LED; patterning the second LED structure layer to form a green light LED; and patterning the third LED structure layer to form a blue light LED.

The compact design of the multi-color LED devices and systems disclosed herein utilizes the lateral overlapping of the light emission LED structures, thereby improving the light emission efficiency, resolution, and overall performance of the LED display systems. Furthermore, the fabrication of the multi-color LED display systems can reliably and efficiently form the LED structure patterns without using or retaining extra substrates. Thus, implementation of the multi-color LED display systems can satisfy the rigorous display requirements for AR and VR, heads-up displays (HUD), mobile device displays, wearable device displays, high definition small projectors, and automotive displays compared with the use of the conventional LEDs.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

Figure 1:
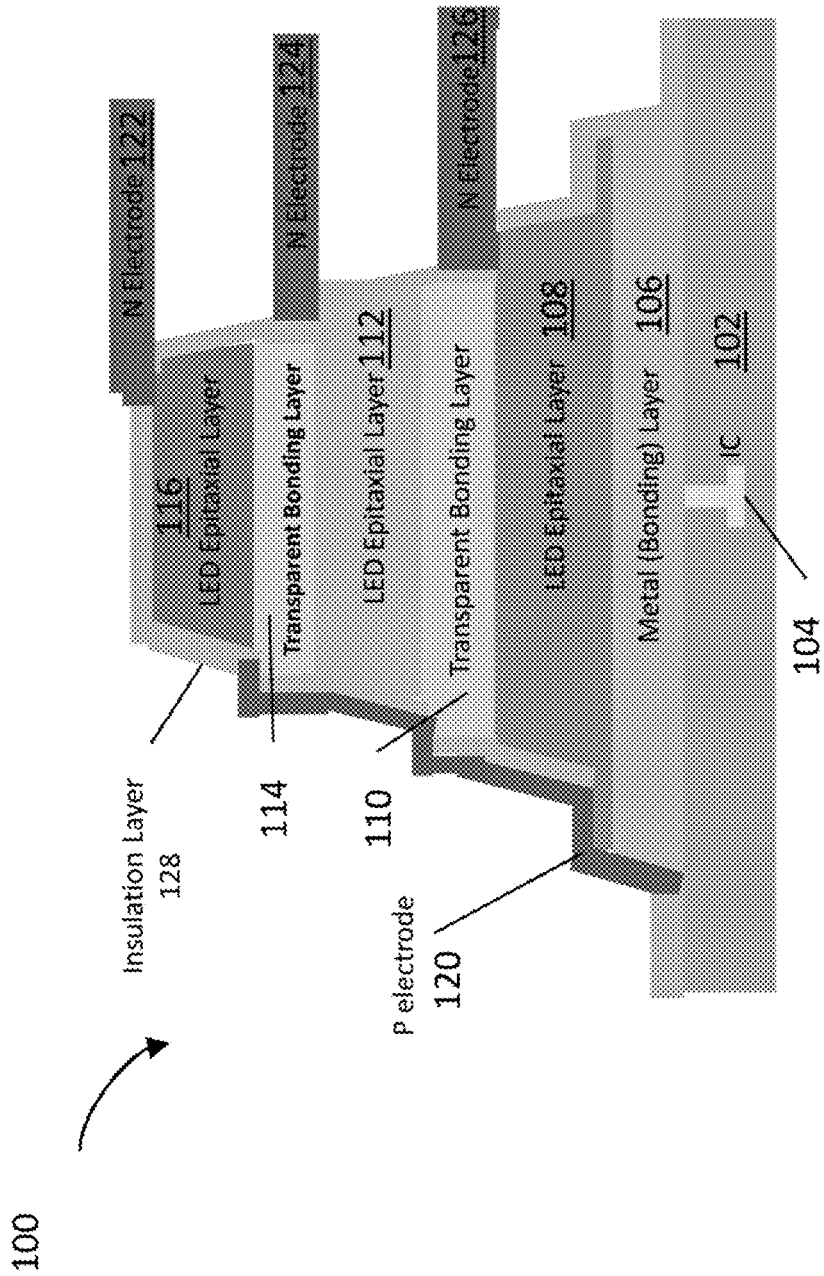
FIG. 1 is a cross-sectional view of a single pixel tri-color coaxial LED device 100, in accordance with some embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

FIG. 1 is a cross-sectional view of a single pixel tri-color coaxial LED device 100, in accordance with some embodiments. In some embodiments, the tri-color coaxial LED device includes a substrate 102. For convenience, "up" is used to mean away from the substrate 102, "down" means toward the substrate 102, and other directional terms such as top, bottom, above, below, under, beneath, etc. are interpreted accordingly. The supporting substrate 102 is the substrate on which the array of individual driver circuits 104 is fabricated. In some embodiments, the driver circuits could also be located in one of the layers above the substrate 102, or above the micro tri-color LED structure 100. Each driver circuit is a pixel driver 104. In some instances, the pixel drivers are thin-film transistor pixel drivers or silicon CMOS pixel drivers. In one embodiment, the substrate 102 is a Si substrate. In another embodiment, the supporting substrate 102 is a transparent substrate, for example, a glass substrate. Other example substrates include GaAs, GaP, InP, SiC, ZnO, and sapphire substrates. The driver circuits 104 form individual pixel drivers to control the operation of the individual single pixel tri-color coaxial LED device 100. The circuitry on substrate 102 includes contacts to each individual pixel driver 104 and also a ground contact. Each micro tri-color LED structure 100 also has two types of contacts: P electrodes or anodes, such as 120, which are connected to the pixel driver; and N electrodes or cathodes, such as 122, 124, and 126, which are connected to the ground (i.e., the common electrode).

Although some features are described herein with the term "layer", it should be understood that such features are not limited to a single layer but may include a plurality of sublayers. In some instance, a "structure" can take the form of a "layer".

In some embodiments, three LED structures including three epitaxial layers 108, 112, and 116, are formed in a stacked structure, for example, the green LED epitaxial layer 112 is directly on top of the red LED epitaxial layer 108, and the blue LED epitaxial layer 112 is directly on top of the green epitaxial layer 112. In some embodiments, the light emitted from the red epitaxial layer 108 is able to propagate through the green epitaxial layer 112 and then through the blue epitaxial layer 116 to be emitted out of the tri-color LED device 100. In some embodiments, the light emitted from the green epitaxial layer 112 is able to propagate through the blue epitaxial layer 116 to be emitted out of the tri-color LED device 100. In some embodiments, an LED structure includes many epitaxial sub-layers with different compositions. Examples of the LED epitaxial structures include III-V nitride, III-V arsenide, III-V phosphide, and III-V antimonide epitaxial structures. Examples of micro LEDs include GaN based UV/blue/green micro LEDs, AlInGaP based red/orange micro LEDs, and GaAs or InP based infrared (IR) micro LEDs.

In some embodiments, each of the stacked LED structures can be controlled individually to generate its individual light. In some embodiments, the combined light from the top LED epitaxial layer as a result from the operations all the LED epitaxial layers in the tri-color coaxial LED device 100 can change the color of the single pixel on a display panel within a small footprint.

In some embodiments, depending on the design of the coaxial LED device 100, the emitted colors of the LED structures included in the same device are not limited to red, green and blue. For example, suitable colors can be selected from a range of different colors from a wavelength of 380 nm to 700 nm in visible color range. In some embodiments, LED structures emitting other colors from invisible range such as ultra-violet and infrared can be implemented. For example, the three-color choice, from bottom to top can be red, green, and blue. In another embodiment, the three-color choice, from bottom to top can be ultra-violet, orange, and infrared. In some embodiments, the wavelength of the light from the LED structure on one layer of the device 100 has to be longer than the wavelength from the LED structure on a layer on top of the current layer. For instance, the wavelength of the light from the bottom epitaxial layer 108 is longer than that of the middle epitaxial layer 112, and the wavelength of the light from the middle epitaxial layer 112 is longer than that of the top epitaxial layer 116. In some embodiments, the wavelength of the light from the LED structure on one layer of the device 100 has to be shorter than the wavelength from the LED structure on a layer on top of the current layer. For instance, the wavelength of the light from the bottom epitaxial layer 108 is shorter than that of the middle epitaxial layer 112, and the wavelength of the light from the middle epitaxial layer 112 is shorter than that of the top epitaxial layer 116.

In some embodiments, an insulation layer 128 covers the top and side walls of the tri-color LED structures. In some embodiments, a P-electrode 120 is placed on a side of the tri-color LED device 100 to connect to the red LED, green LED and blue LED structures. In some embodiments, separate N-electrodes are placed to connect to each of the red LED, green LED, and blue LED structures. For example, N-electrode 126 is connected to the red LED structure including the LED epitaxial layer 108. N-electrode 124 is connected to the green LED structure including the LED epitaxial layer 112. N-electrode 122 is connected to the blue LED structure including the LED epitaxial layer 116.

In some embodiments, the bottom epitaxial layer 108 is bonded to the substrate through a metal bonding layer 106. In some embodiments, the metal bonding layer 106 can also be used as a reflector to reflect light emitted from the LED structures above. In some embodiments, the middle epitaxial layer 112 is bonded to the bottom epitaxial layer 108 through a first transparent bonding layer 110. In some embodiments, the top epitaxial layer 116 is bonded to the middle epitaxial layer 112 through a second transparent bonding layer 114. In some embodiments, the transparent bonding layers can facilitate the light emitted from the layers below the bonding layers to pass through.

In some embodiments, reflection layers are formed between the LED epitaxial layers to improve light emission efficiency, which will be further described below. In some embodiments, conductive transparent layers are formed between the LED epitaxial layers to improve conductivity and transparency.

Figure 2A:
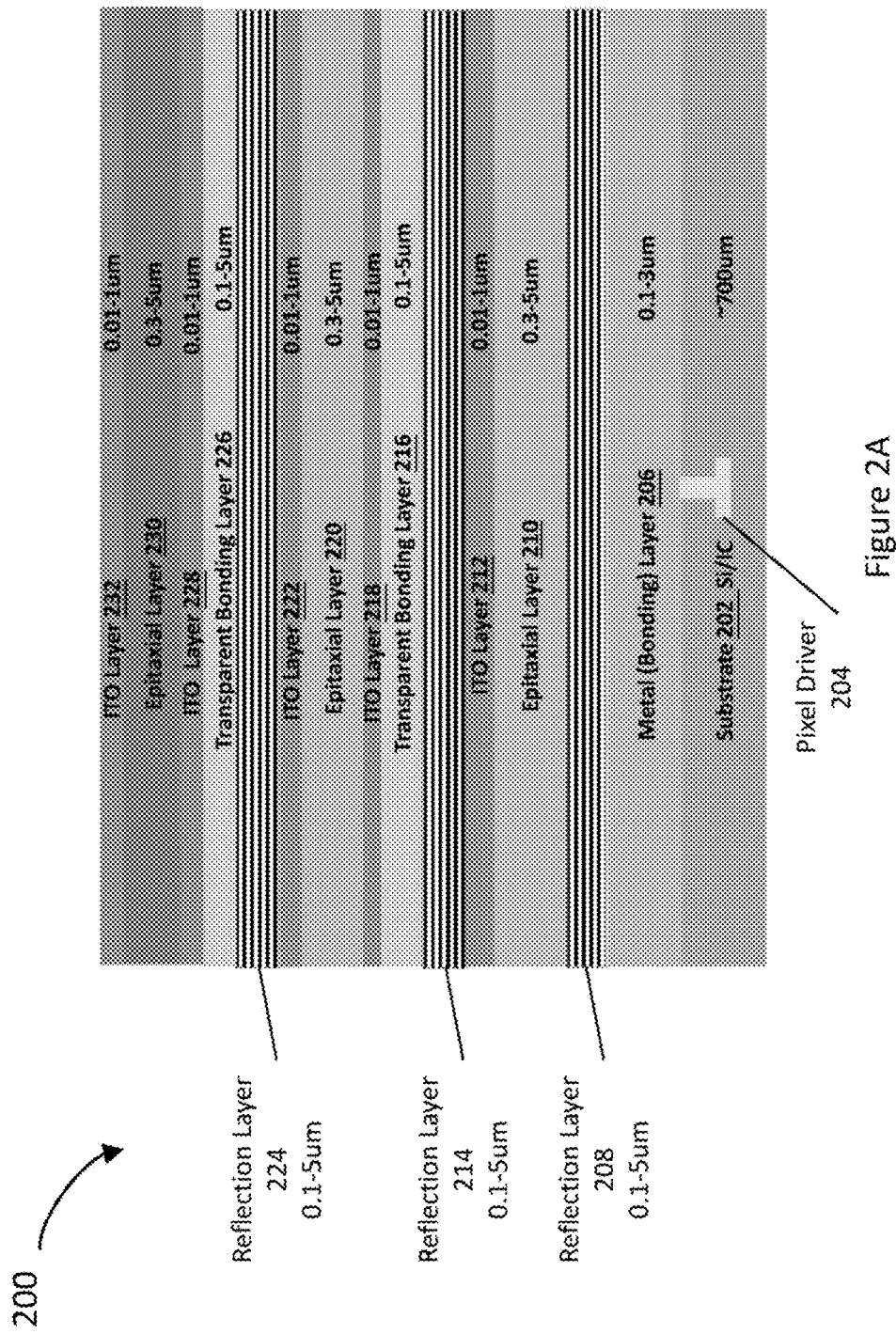
FIG. 2A is a cross-sectional view of a multiple layer structure 200 for forming the tri-color coaxial LED device, in accordance with some embodiments.

FIG. 2A is a cross-sectional view of a multiple layer structure 200 for forming the tri-color coaxial LED device, in accordance with some embodiments. More specifically, FIG. 2A illustrates fabrication of the multiple layers on a substrate for the tri-color coaxial LED device.

FIG. 2A shows the substrate 202 supporting the pixel driver 204. In some embodiments, the substrate 202 consists of Silicon and is around 700 microns thick. In one approach, a metal (bonding) layer 206 is grown on the substrate 202. The metal (bonding) layer 206 may include ohmic contact layers, and metal bonding layers. In some embodiments, the thickness of the metal (bonding) layer 206 is about 0.1 micron to about 3 microns. In some instances, two metal layers are included in the metal (bonding) layer 206. One of the metal layers is deposited on an epitaxial layer 210, or on a reflection layer 208, which is immediately above the metal (bonding) layer 206. A counterpart metal bonding layer is also deposited on the substrate 202 with the pixel driver 204. In some embodiments, compositions for the metal (bonding) layer 206 include Au—Au bonding, Au—Sn bonding, Au—In bonding, Ti—Ti bonding, Cu—Cu bonding, or a mixture thereof. For example, if Au—Au bonding is selected, the two layers of Au respectively need a Cr coating as an adhesive layer, and Pt coating as an anti-diffusion layer. And the Pt coating is between the Au layer and the Cr layer. The Cr and Pt layers are positioned on the top and bottom of the two bonded Au layers. In some embodiments, when the thicknesses of the two Au layers are about the same, under a high pressure and a high temperature, the mutual diffusion of Au on both layers bonds the two layers together. Eutectic bonding, thermal compression bonding, and transient liquid phase (TLP) bonding are example techniques that may be used.

In some embodiments, the epitaxial layer 210 is bonded on top of the existing structure of substrate 202 with the pixel driver 204 through the metal (bonding) layer 206. In one approach, the epitaxial layer 210 is grown on a separate substrate (referred to as the epitaxy substrate). The epitaxy substrate is then removed after bonding, for example, by a laser lift-off process or wet chemical etching, leaving the structure shown in FIG. 2A.

In some embodiments, the reflection layer 208 is coated on the epitaxial layer 210 before bonding. The reflection layer 208 is between the metal (bonding) layer 206 and the epitaxial layer 210 after bonding. In some instances, the thickness of the reflection layer 208 is about 0.1 micron to about 5 microns. In some embodiments, the reflection layer 208 includes a distributed Bragg reflector (DBR) structure. For example, the reflection layer 208 is formed from multiple layers of alternating or different materials with varying refractive index. In some instances, each layer boundary of the DBR structure causes a partial reflection of an optical wave. The reflection layer 208 can be used to reflect some selected wavelengths, for example, red light. In some embodiments, the reflection layer 208 is made of multiple layers of SiO2 and Ti3O5. By varying the thicknesses and numbers of layers of SiO2 and Ti3O5 respectively, selective reflection or transmission of light at different wavelengths can be formed. In some embodiments, the reflection layer 208 for a red light LED includes multiple layers of Au or/and Indium Tin Oxide (ITO).

In some embodiments, the reflection layer 208 for a red light LED structure has a low absorbance (for example, equal or less than 5%) of the light generated by different layers of the tri-color LED device. In some embodiments, the reflection layer 208 for a red light LED structure has a high reflectance (for example, equal or more than 95%) of the light generated above the current reflection layer, for example, the red light, the green light and the blue light.

In some embodiments, the epitaxial layer 210 is for forming red micro LEDs. Examples of a red LED epitaxial structure include III-V nitride, III-V arsenide, III-V phosphide, and III-V antimonide epitaxial structures. In some instances, films within the red LED epitaxial layer 210 can include the layers of P-type GaP/P-type AlGaInP light-emitting layer/AlGaInP/N-type AlGaInP/N-type GaAs. In some embodiments, P type is generally Mg-doped, and N-type is generally Si-doped. In some examples, the thickness of the epitaxial layer 210 is about 0.3 micron to about 5 microns.

In some embodiments, above the epitaxial layer 210 is an Indium Tin Oxide (ITO) layer 212, a transparent conducting oxide. In some embodiments, the thickness of the ITO layer 212 is about 0.01 micron to about 1 micron. In some instances, before any bonding process with the next epitaxial layer, the ITO layer 212 is deposited on the epitaxial layer 210 commonly by vapor deposition, for example, electron beam evaporation or sputtering deposition. In some examples, ITO layers are used to maintain a good conductivity for electrode connection while in some instances, improving optical properties of the LED devices, such as reflectivity or transparency.

In some embodiments, a second reflection layer 214 is coated on the ITO layer 212 before any bonding process with the next epitaxial layer. In some instances, the thickness of the reflection layer 214 is about 0.1 micron to about 5 microns. In some embodiments, the reflection layer 214 includes a DBR structure. For example, the reflection layer 214 is formed from multiple layers of alternating or different materials with varying refractive index. In some instances, each layer boundary of the DBR structure causes a partial reflection of an optical wave. The reflection layer 214 can be used to reflect some selected wavelengths, for example, green light. In some embodiments, the reflection layer 214 is made of multiple layers of SiO2 and Ti3O5. By varying the thicknesses and numbers of layers of SiO2 and Ti3O5 respectively, selective reflection or transmission of light at different wavelengths can be formed.

In one example, the following DBR structure shown in table 1 is used to reflect green light from a green light LED:

TABLE 1

DBR layer structure for a green light LED reflection layer.

| Layer composition | Layer thickness (in nanometer) |
|---|---|
| SiO2 | 1000 |
| TiO2 | 109.54 |
| SiO2 | 318.48 |
| TiO2 | 64.95 |
| SiO2 | 106.07 |
| TiO2 | 245.76 |
| SiO2 | 137.08 |
| TiO2 | 65.14 |
| SiO2 | 106.77 |
| TiO2 | 338.95 |
| SiO2 | 37.27 |
| TiO2 | 12.41 |
| SiO2 | 352.18 |
| TiO2 | 70.83 |
| SiO2 | 229.25 |
| ITO | 20 |

In some embodiments, the reflection layer 214 for a green light LED structure has a low absorbance (for example, equal or less than 5%) of the light generated by different layers of the tri-color LED device. In some embodiments, the reflection layer 214 for a green light LED structure has a high reflectance (for example, equal or more than 95%) of the light generated above the current reflection layer, for example, the green light and the blue light.

In some embodiments, a second epitaxial layer 220 is bonded on top of the first epitaxial layer 210 through the transparent bonding layer 216. In one approach, the second epitaxial layer 220 is grown on a separate substrate (referred to as the epitaxy substrate). The epitaxy substrate is then removed after bonding, for example, by a laser lift-off process or wet chemical etching, leaving the structure shown in FIG. 2A.

In some embodiments, the transparent bonding layer 216 is made of transparent plastic (resin) or SiO2, such as spin-on glass (SOG), bonding adhesive Micro Resist BCL-1200, etc. The thickness of the transparent bonding layer 216 is about 0.1 micron to about 5 microns.

In some embodiments, the second epitaxial layer 220 is for forming green micro LEDs. Examples of a green LED epitaxial structure include III-V nitride, III-V arsenide, III-V phosphide, and III-V antimonide epitaxial structures. In some instances, films within the green LED epitaxial layer 220 can include the layers of P-type GaN/InGaN light-emitting layer/N-type GaN. In some embodiments, P type is generally Mg-doped, and N-type is generally Si-doped. In some examples, the thickness of the second epitaxial layer 220 is about 0.3 micron to about 5 microns.

In some embodiments, an ITO layer 218 is deposited on the second epitaxial layer 220 before bonding. The ITO layer 218 is between the transparent bonding layer 216 and the second epitaxial layer 220 after bonding. In some embodiments, the thickness of the ITO layer 218 is about 0.01 micron to about 1 micron.

In some embodiments, another ITO layer 222 is deposited on top of the second epitaxial layer 220 before any bonding process with the next epitaxial layer. In some embodiments, the thickness of the ITO layer 218 is about 0.01 micron to about 1 micron.

In some embodiments, a third reflection layer 224 is coated on the ITO layer 222 before any bonding process with the next epitaxial layer. In some instances, the thickness of the reflection layer 224 is about 0.1 micron to about 5 microns. In some embodiments, the reflection layer 224 includes a DBR structure. For example, the reflection layer 224 is formed from multiple layers of alternating or different materials with varying refractive index. In some instances, each layer boundary of the DBR structure causes a partial reflection of an optical wave. The reflection layer 224 can be used to reflect some selected wavelengths, for example, blue light. In some embodiments, the reflection layer 224 is made of multiple layers of SiO2 and Ti3O5. By varying the thicknesses and numbers of layers of SiO2 and Ti3O5 respectively, selective reflection or transmission of light at different wavelengths can be formed.

In one example, the following DBR structure shown in table 2 is used to reflect blue light from a blue light LED:

TABLE 2

DBR layer structure for a blue light LED reflection layer.

| Layer composition | Layer thickness (in nanometer) |
| --- | --- |
| SiO2 | 1000 |
| SiO2 | 183.36 |
| TiO2 | 96 |
| SiO2 | 84.65 |
| TiO2 | 51.37 |
| SiO2 | 332.37 |
| TiO2 | 79.95 |
| SiO2 | 423.13 |
| TiO2 | 52.99 |
| SiO2 | 35.87 |
| TiO2 | 235.03 |
| SiO2 | 253.67 |
| TiO2 | 64.38 |
| SiO2 | 336.08 |
| ITO | 20 |

In some embodiments, the reflection layer 224 for a blue light LED structure has a low absorbance (for example, equal or less than 5%) of the light generated by different layers of the tri-color LED device. In some embodiments, the reflection layer 224 for a blue light LED structure has a high reflectance (for example, equal or more than 95%) of the light generated above the current reflection layer, for example, the blue light.

In some embodiments, a third epitaxial layer 230 is bonded on top of the second epitaxial layer 220 through the transparent bonding layer 226. In one approach, the third epitaxial layer 230 is grown on a separate substrate (referred to as the epitaxy substrate). The epitaxy substrate is then removed after bonding, for example, by a laser lift-off process or wet chemical etching, leaving the structure shown in FIG. 2A.

In some embodiments, the transparent bonding layer 226 is made of transparent plastic (resin) or SiO2, such as spin-on glass (SOG), bonding adhesive Micro Resist BCL-1200, etc. The thickness of the transparent bonding layer 226 is about 0.1 micron to about 5 microns.

In some embodiments, the third epitaxial layer 230 is for forming blue micro LEDs. Examples of a blue LED epitaxial structure include III-V nitride, III-V arsenide, III-V phosphide, and III-V antimonide epitaxial structures. In some instances, films within the blue LED epitaxial layer 230 can include the layers of P-type GaN/InGaN light-emitting layer/N-type GaN. In some embodiments, P type is generally Mg-doped, and N-type is generally Si-doped. In some examples, the thickness of the third epitaxial layer 230 is about 0.3 micron to about 5 microns.

In some embodiments, an ITO layer 228 is deposited on the third epitaxial layer 230 before bonding. The ITO layer 228 is between the transparent bonding layer 226 and the third epitaxial layer 230 after bonding. In some embodiments, the thickness of the ITO layer 228 is about 0.01 micron to about 1 micron.

In some embodiments, another ITO layer 232 is deposited on top of the third epitaxial layer 230. In some embodiments, the thickness of the ITO layer 232 is about 0.01 micron to about 1 micron.

Figure 2B:
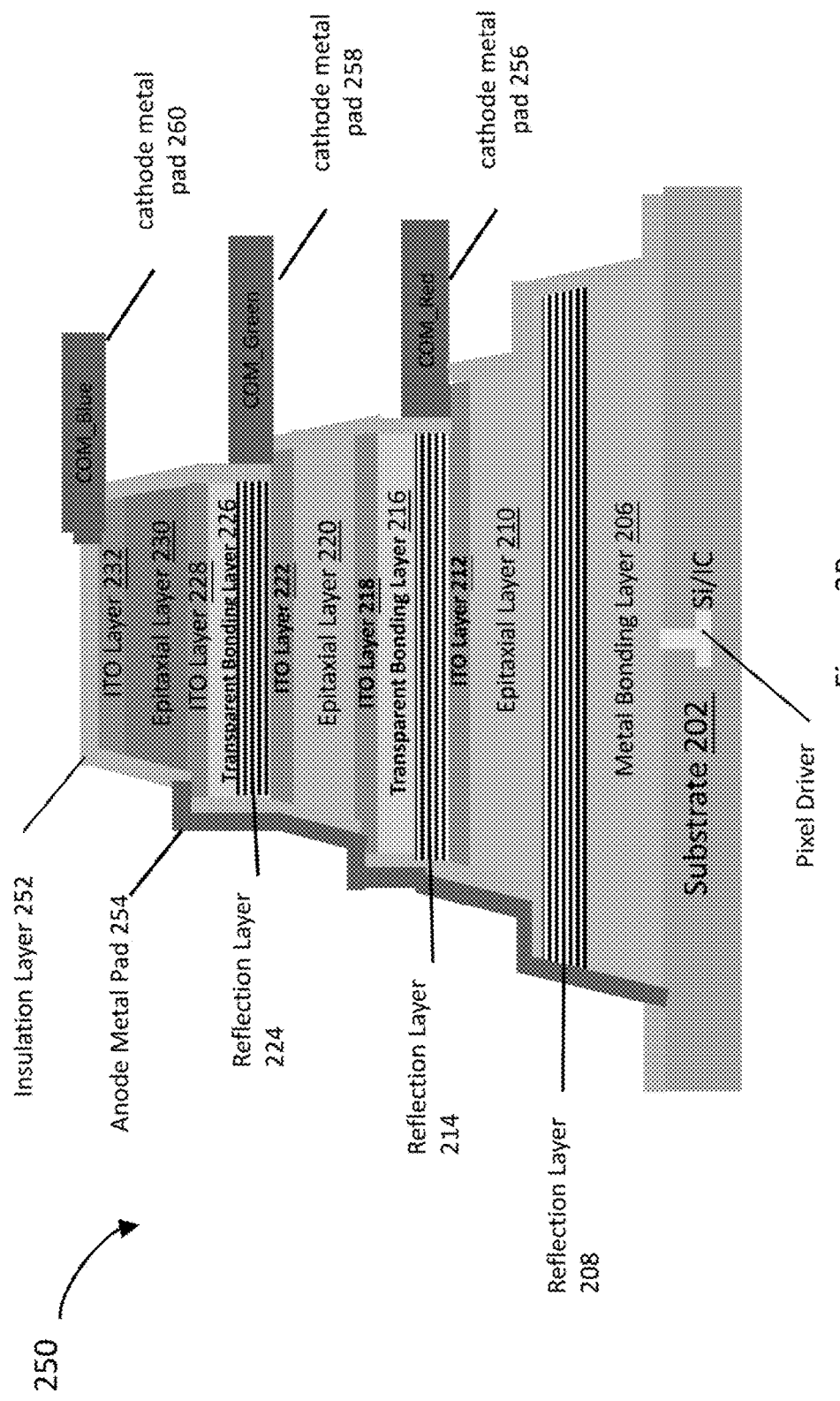
FIG. 2B is a cross-sectional view of a tri-color coaxial LED device 250 after the fabrication process, in accordance with some embodiments.

FIG. 2B is a cross-sectional view of a tri-color coaxial LED device 250 after the fabrication process, in accordance with some embodiments. More specifically, FIG. 2B further illustrates the tri-color coaxial LED device 250 after some additional fabrication processes especially patterning of the multiple layer structure 200.

In some embodiments, through dry etching and wet etching, a tri-color LED structure is formed and the axes of LED structures of different colors are aligned with one another vertically. In some embodiments, the LED structures of different colors share the same axis. In some embodiments, the LED structures of different colors form a pyramid like shape or a trapezoidal cross-sectional shape, with the lateral dimension of the bottom LED structure being the longest and the lateral dimension of the top LED structure being the shortest. Each layer has a narrower width or smaller area compared to a layer beneath it. In this instance, the width or area is measured by the dimensions of a plane parallel to the surface of the substrate 202. In some embodiments, the bottom layer such as the metal (bonding) layer 206 has lateral dimension of about 1 micron to about 500 microns. A pyramid like shape will improve the electronic connections between the individual LED structures and to the electrodes, and simplify the fabrication process. For example, the electrode connections are exposed in each layer for easy connection.

In some embodiments, the aspect ratio of a cross section of a layer of the tri-color LED device remains substantially the same when the lateral dimension of the same layer varies. For example, when the lateral dimension of a patterned epitaxial layer is 5 microns, the thickness of the patterned epitaxial layer is less than a micron. In another example, when the lateral dimension of the same patterned epitaxial layer increases, the thickness of the same patterned epitaxial layer increases accordingly to maintain the same aspect ratio. In some embodiments, the aspect ratio of the cross-section of the epitaxial layers and other layers is less than $1/5$ in thickness/width.

The shape of the LED device is not limited and in some other embodiments, the cross-sectional shape of the tri-color coaxial LED device can take the form of other shapes, for example, a reverse trapezoid, a semi-oval, a rectangle, a parallelogram, a triangle, or a hexagon, etc.

In some embodiments, after all the layers illustrated in FIG. 1A are formed, the top ITO layer 232 above the third epitaxial layer 230 is patterned using photolithography and etching. In some instances, the etching method used to form the pattern is dry etching, for example, inductively coupled plasma (ICP) etching, or wet etching with an ITO etching solution. In some embodiments, the same patterning methods can apply to all the other ITO layers, including ITO layers 212, 218, 222, 228 within the structure 200.

In some embodiments, the blue LED epitaxial layer 230 and the green LED epitaxial layer 220 are patterned using photolithography and etching. In some instances, the etching method used to form the pattern is dry etching, for example, inductively coupled plasma (ICP) etching, with Cl2 and BCl3 etching gases.

In some embodiments, the transparent bonding layers including 216 and 226 are patterned using photolithography and etching. In some instances, the etching method used to form the pattern is dry etching, for example, inductively coupled plasma (ICP) etching, with CF4 and O2 etching gases.

In some embodiments, the reflection layers including 208, 214 and 224 are patterned using photolithography and etching. In some instances, the etching method used to form the pattern for the reflection layers especially the DBR layers is dry etching, for example, inductively coupled plasma (ICP) etching, with CF4 and O2 etching gases, or ion beam etching (IBE) with Ar gas.

In some embodiments, the red LED epitaxial layer 210 is patterned using photolithography and etching. In some instances, the etching method used to form the pattern is dry etching, for example, inductively coupled plasma (ICP) etching, with Cl2 and HBr etching gases.

In some embodiments, the metal (bonding) layer 206 is patterned using photolithography and etching. In some instances, the etching method used to form the pattern is dry etching, for example, inductively coupled plasma (ICP) etching, with Cl2/BCl3/Ar etching gases, or ion beam etching (IBE) with Ar gas.

In some embodiments, after the LED device structure is patterned, an insulation layer 252 is deposited on the surface of the patterned LED device structure including all the patterned layers, side walls, and the exposed substrate. In some embodiments, the insulation layer 252 is made of SiO2 and/or Si3N4. In some embodiments, the insulation layer 252 is made of TiO2. In some embodiments, the insulation layer 252 is formed with composition similar to SiO2 after curing a layer such as SOG at a high temperature. In some embodiments, the insulation layer 252 is made of a material that has a similar thermal coefficient of the layers underneath the insulation layer 252.

In some embodiments, the insulation layer 252 is patterned to expose the electrode contact area using photolithography and etching. In some instances, the etching method used to form the pattern is dry etching, for example, inductively coupled plasma (ICP) etching, with CF4 and O2.

In some embodiments, anode metal pad 254 is vapor deposited on a suitable location of the patterned LED structure, such as on one side, to cover the red LED structure, the green LED structure, and the blue LED structure. In some embodiments, anode metal pad 254 is made to connect to the bottom metal (bonding) layer 206 of the red LED epitaxial layer 210, the bottom conductive ITO layer 218 of the green LED epitaxial layer 220, and the bottom conductive ITO layer 228 of the blue LED epitaxial layer 230. The anode metal pad 254 is also electrically connected to the integrated circuits including the pixel driver 204 on the substrate 202 through the metal (bonding) layer 206.

In some embodiments, separate cathode metal pads are placed to connect to each of the red LED epitaxial layer, green LED epitaxial layer and blue LED epitaxial layer. For example, cathode metal pad 256 is vapor deposited on a side of the patterned LED structure to connect to the red LED epitaxial layer 210 through the conductive ITO layer 212 on top of the red LED epitaxial layer 210. In some embodiments, cathode metal pad 258 is vapor deposited on a side of the patterned LED structure to connect to the green LED epitaxial layer 220 through the conductive ITO layer 222 on top of the green LED epitaxial layer 220. In some embodiments, cathode metal pad 260 is vapor deposited on a side of the patterned LED structure to connect to the blue LED epitaxial layer 230 through the conductive ITO layer 232 on top of the blue LED epitaxial layer 230.

In some embodiments, the external quantum efficiency for the red LED structure within the tri-color LED device is about 0.5-5%. In some embodiments, the external quantum efficiency for the green LED structure within the tri-color LED device is about 2-10%. In some embodiments, the external quantum efficiency for the blue LED structure within the tri-color LED device is about 5-15%. In some embodiments, the external quantum efficiency of the LED structure for each color is measured when the effects of all the related layers in addition to the LED structure such as reflection layers, bonding layers, ITO layers, and insulation layers are counted.

In some embodiments, the external quantum efficiency for the tri-color LED device 250 is about 20% or above. In some embodiments, the external quantum efficiency of the multi-color LED device is measured when the effects of all the layers in addition to the LED structure layers such as reflection layers, bonding layers, ITO layers, and insulation layers are counted.

Various design aspects of the tri-color coaxial LED system 250, such as the dimensions of the layers (e.g., width, length, height, and cross-sectional area of each layer), the dimension of the electrodes, size, shape, spacing, and arrangement of the two or more LED structure layers, bonding layers, reflection layers and the conductive layers, and the configuration between the integrated circuits, pixel driver and electrical connections are selected (e.g., optimized using a cost or performance function) for obtaining the desired LED characteristics. LED characteristics that vary based on the above design aspects include, e.g., size, materials, cost, fabrication efficiency, light emission efficiency, power consumption, directivity, luminous intensity, luminous flux, color, spectrum and spatial radiation pattern.

Figure 3:
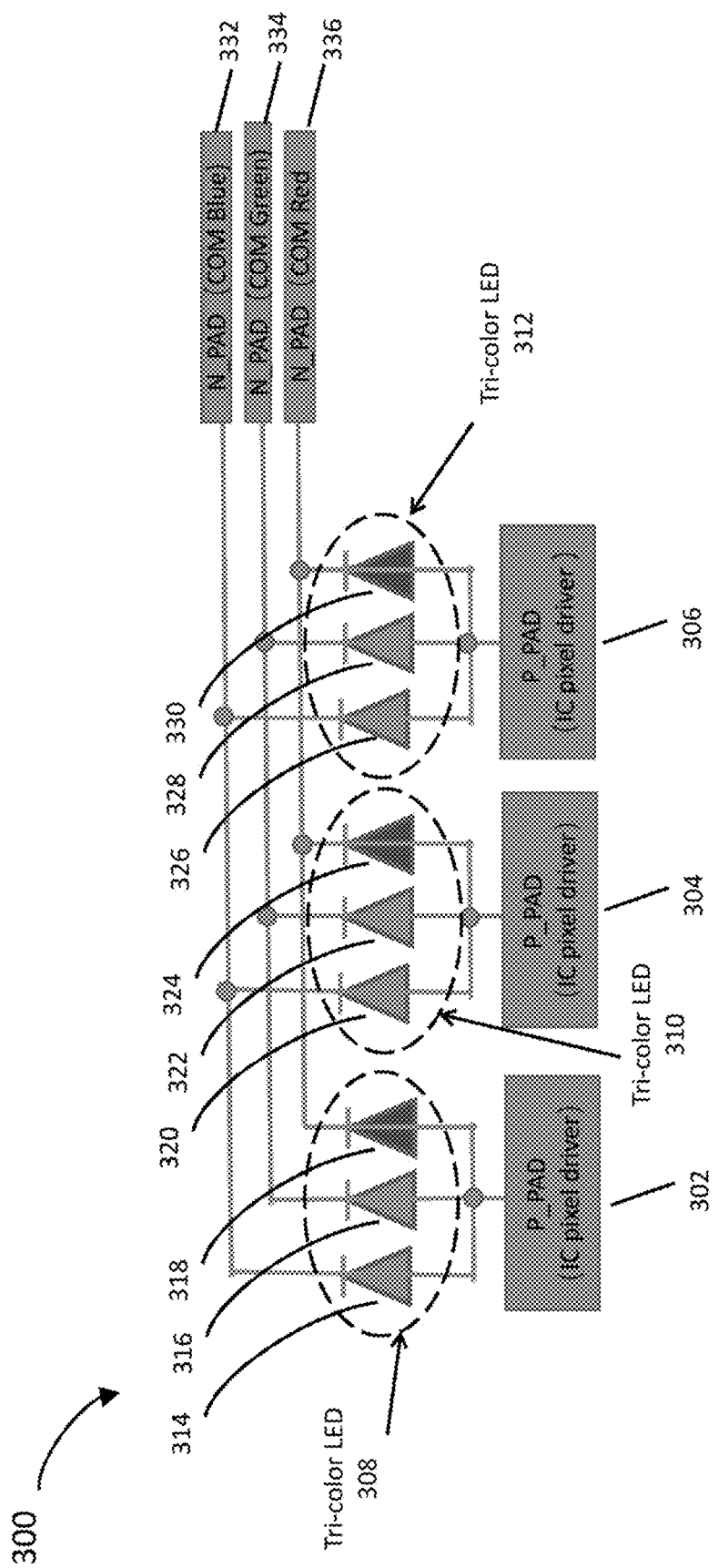
FIG. 3 is a circuit diagram illustrating a matrix of tri-color LED devices 300, in accordance with some embodiments.

FIG. 3 is a circuit diagram illustrating a matrix of tri-color LED devices 300, in accordance with some embodiments. The circuit in FIG. 3 includes three pixel drivers 302, 304, and 306 and three tri-color coaxial LED devices 308, 310, and 312.

In some embodiments, a display panel includes a plurality of pixels, such as millions of pixels, and each pixel includes a tri-color LED device structure. In some embodiments, the LED device structures can be micro LEDs. Micro LEDs typically have a lateral dimension of 50 microns (um) or less, and can have lateral dimensions less than 10 um and even just a few um.

In some embodiments, the pixel driver, for example 302, includes a number of transistors and capacitors (not shown in FIG. 3). The transistors include a driving transistor connected to a voltage supply, and a control transistor configured with its gate connected to a scan signal bus line. The capacitors include a storage capacitor used maintain the gate voltage of the driving transistor during the time that the scan signal is setting other pixels.

In this example, each of the three tri-color LED devices, for example 308, have its own integrated circuit (IC) pixel driver 302. The tri-color LED device 308 for a single pixel can be viewed as three individual LEDs with different colors connected in parallel. For example, the red LED 318, green LED 316, and blue LED 314, within the same tri-color LED device 308, are connected to the same IC pixel driver 302 via a shared P-electrode pad or anode, such as metal pad 254 in FIG. 2B.

In some embodiments, each of the red, green, and blue LEDs within the same tri-color LED device 308 is connected to separate N-electrode pad or cathode. For example, the red LED is connected to the N-electrode 336, such as metal pad 256 in FIG. 2B. The green LED is connected to the N-electrode 334, such as metal pad 258 in FIG. 2B. The blue LED is connected to the N-electrode 332, such as metal pad 260 in FIG. 2B.

In some embodiments, all the red LEDs, for example, 318, 324 and 330, from different tri-color LED devices, are connected to the same common N-electrode 336. All the green LEDs for example, 316, 322 and 328, from different tri-color LED devices, are connected to the same common N-electrode 334. All the blue LEDs, for example, 314, 320 and 326, from different tri-color LED devices, are connected to the same common N-electrode 332. The use of the common electrodes simplifies the fabrication process and reduces the area of the LED devices especially the footprint of the electrodes.

Figure 4:
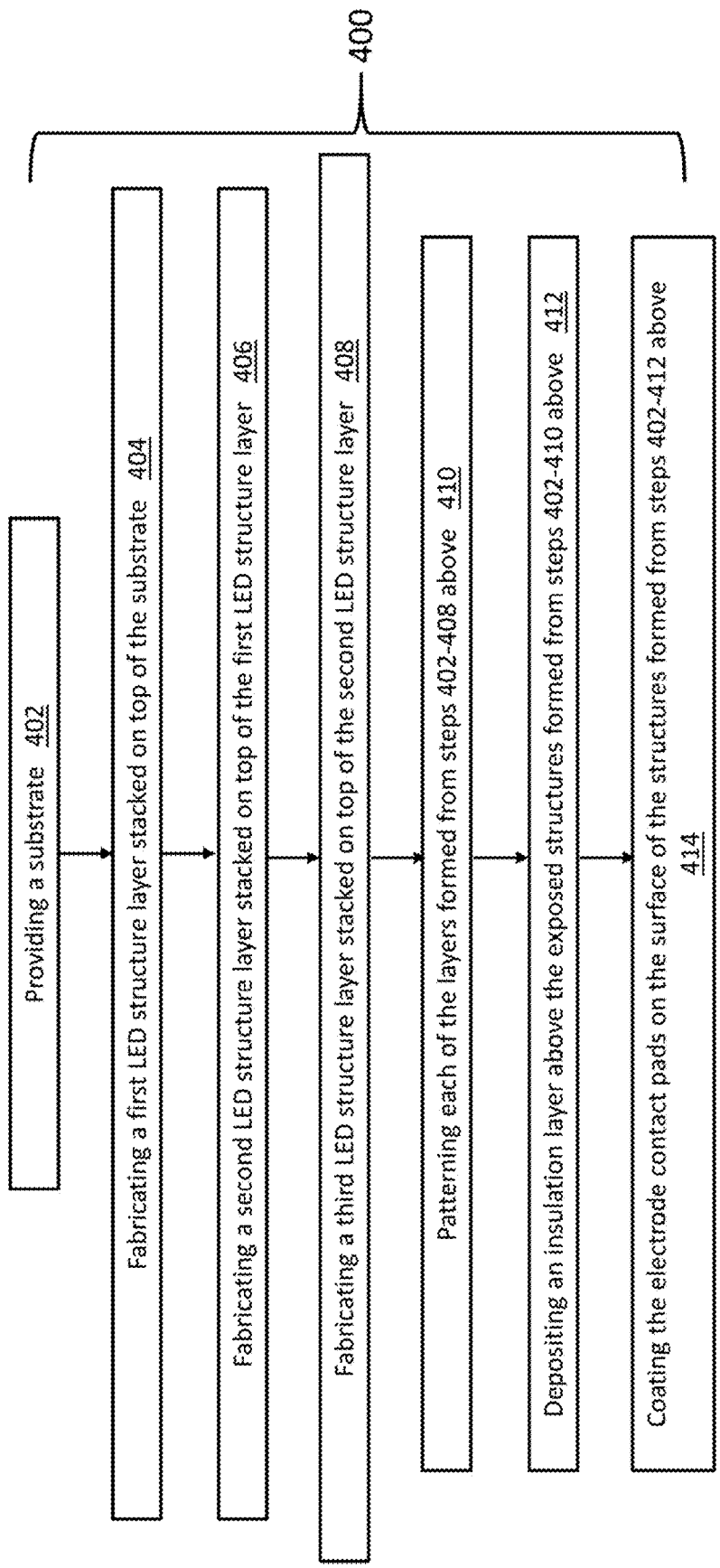
FIG. 4 is a flow diagram showing a method 400 of fabricating a tri-color coaxial LED device, in accordance with some embodiments.

FIG. 4 is a flow diagram showing a method of fabricating a tri-color coaxial LED device 400, in accordance with some embodiments.

Operations (e.g., steps) of the method 400 may be performed corresponding to embodiments described in FIGS. 1, 2A, 2B and 3 above.

The method 400 includes a step 402 of providing a substrate. In some embodiments, a pixel driver is formed in the substrate.

The method 400 also includes a step 404 of fabricating a first LED structure layer stacked on top of the substrate. In some embodiments, the first LED structure layer includes a first epitaxial structure. In some embodiments, the first LED structure layer is bonded on the substrate by a first bonding layer. In some embodiments, a first reflection layer is coated on the first LED structure layer at the side facing the substrate before the bonding of the substrate and the first LED structure layer. And in some instances, the first reflection layer is between the first bonding layer and the first epitaxial structure after bonding. In some embodiments, the first bonding layer is a conductive layer at the bottom of the first LED structure layer, and the first bonding layer is electrically connected to both the pixel driver and the bottom of the first LED structure layer. In some embodiments, a first upper conductive layer is coated at the top of the first LED structure layer to electrically connect to the top of the first LED structure layer and a common electrode.

The method 400 further includes a step 406 of fabricating a second LED structure layer stacked on top of the first LED structure layer. In some embodiments, the second LED structure layer includes a second epitaxial structure. In some embodiments, the second LED structure is bonded on the first LED structure by a second bonding layer. In some embodiments, a second reflection layer is coated on the first LED structure layer at the side facing the second LED structure layer before the bonding of the first LED structure layer and the second LED structure layer. And in some instances, the second reflection layer is between the first upper conductive layer and the second bonding layer after bonding. In some embodiments, a second lower conductive layer is coated at the bottom of the second LED structure layer, and the second lower conductive layer is electrically connected to both the pixel driver and the bottom of the second LED structure layer. In some embodiments, a second upper conductive layer is coated at the top of the second LED structure layer to electrically connect to the top of the second LED structure layer and a common electrode.

The method 400 further includes a step 408 of fabricating a third LED structure layer stacked on top of the second LED structure layer. In some embodiments, the third LED structure layer includes a third epitaxial structure. In some embodiments, the third LED structure is bonded on the second LED structure by a third bonding layer. In some embodiments, a third reflection layer is coated on the second LED structure layer at the side facing the third LED structure layer before the bonding of the second LED structure layer and the third LED structure layer. And in some instances, the third reflection layer is between the second upper conductive layer and the third bonding layer after bonding. In some embodiments, a third lower conductive layer is coated at the bottom of the third LED structure layer, and the third lower conductive layer is electrically connected to both the pixel driver and the bottom of the third LED structure layer. In some embodiments, a third upper conductive layer is coated at the top of the third LED structure layer to electrically connect to the top of the third LED structure layer and a common electrode.

In some embodiments, the first LED structure layer, the second LED structure layer, and the third LED structure layer substantially overlap laterally with one another to form a light path that combines light emitted from the first LED structure layer, the second LED structure layer and the third LED structure layer.

The method 400 further includes a step 410 of patterning each of the layers formed from steps 402-408 described above by photolithography and etching to form three LEDs directly stacked together.

The method 400 further includes a step 412 of depositing an insulation layer above the exposed structures formed from steps 402-410 described above and etching the insulation layer for coating the electrode contact pads.

The methods 400 further includes a step of 414 of coating the electrode contact pads on the surface of the structures formed from steps 402-412. In some embodiments, an anode metal contact pad is coated to electrically connect to the lower conductive layer of each of the first, second and third LED structure layers, and the pixel drive. In some embodiments, a first cathode metal contact pad is coated to electrically connect to the upper conductive layer of the first LED structure layer. In some embodiments, a second cathode metal contact pad is coated to electrically connect to the upper conductive layer of the second LED structure layer. In some embodiments, a third cathode metal contact pad is coated to electrically connect to the upper conductive layer of the third LED structure layer.

Further embodiments also include various subsets of the above embodiments including embodiments in FIGS. 1, 2A, 2B, 3, and 4 combined or otherwise re-arranged in various embodiments.

Figure 5:
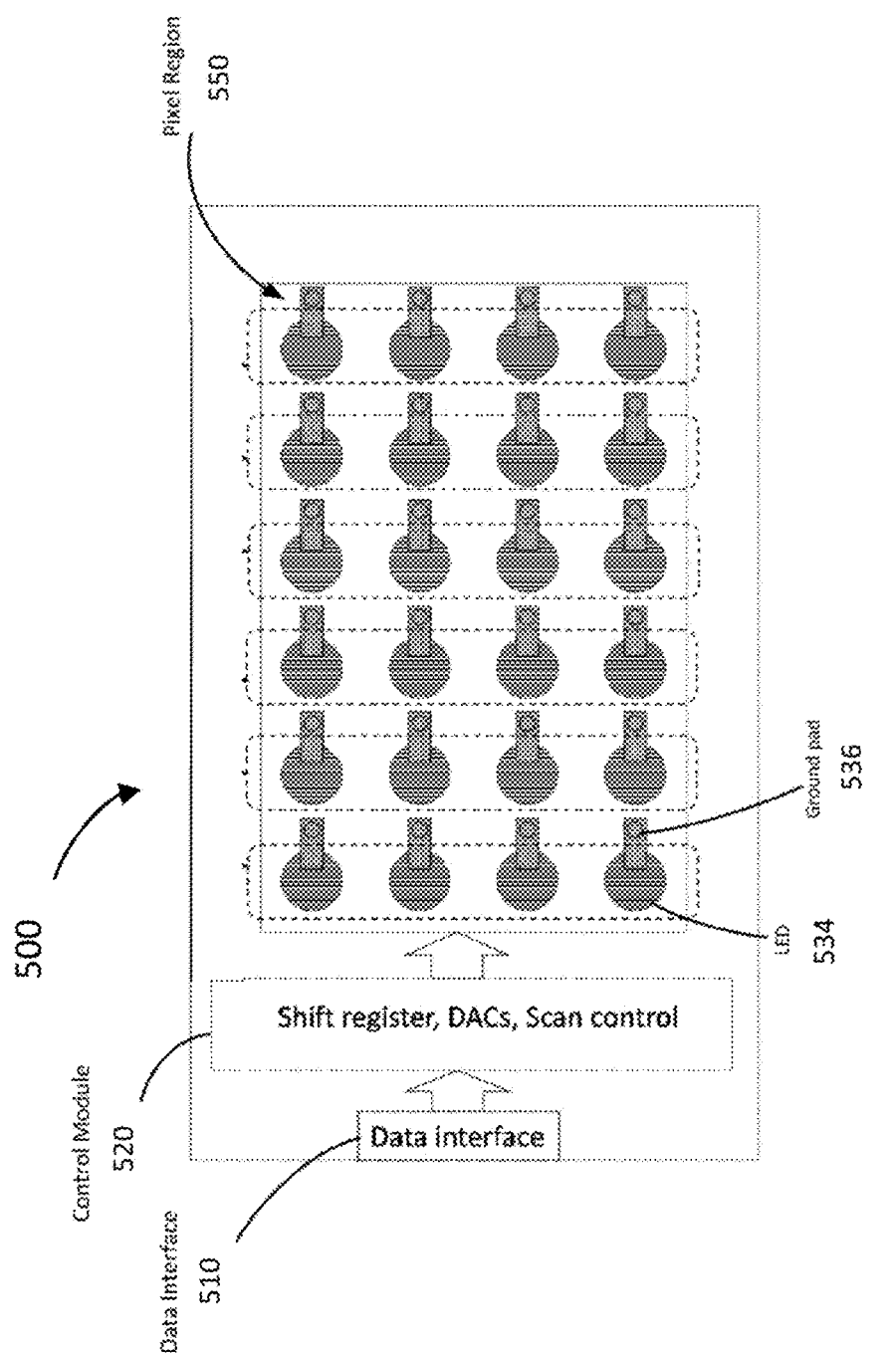
FIG. 5 is a top view of a micro LED display panel 500, in accordance with some embodiments.

FIG. 5 is a top view of a micro LED display panel 500, in accordance with some embodiments. The display panel 500 includes a data interface 510, a control module 520 and a pixel region 550. The data interface 510 receives data defining the image to be displayed. The source(s) and format of this data will vary depending on the application. The control module 520 receives the incoming data and converts it to a form suitable to drive the pixels in the display panel. The control module 520 may include digital logic and/or state machines to convert from the received format to one appropriate for the pixel region 550, shift registers or other types of buffers and memory to store and transfer the data, digital-to-analog converters and level shifters, and scan controllers including clocking circuitry.

The pixel region 550 includes an array of pixels. The pixels include micro LEDs, such as a tri-color coaxial LED 534, integrated with pixel drivers, for example as described above. In this example, the display panel 500 is a color RGB display panel. It includes red, green and blue pixels. Within each pixel, the tri-color coaxial LED 534 is controlled by a pixel driver. The pixel makes contact to a supply voltage (not shown) and ground via a ground pad 536, and also to a control signal, according to the embodiments shown previously. Although not shown in FIG. 5, the p-electrode of the tri-color coaxial LED 534 and the output of the driving transistor are positioned within the LED 534, and they are electrically connected by the bonding metal layer, such as the metal layer 204 in FIG. 2A. The LED current driving signal connection (between p-electrode of LED and output of the pixel driver), ground connection (between n-electrode and system ground), the supply voltage Vdd connection (between source of the pixel driver and system Vdd), and the control signal connection to the gate of the pixel driver are made in accordance with various embodiments.

FIG. 5 is merely a representative figure. Other designs will be apparent. For example, the colors do not have to be red, green and blue. They also do not have to be arranged in columns or stripes. As one example, apart from the arrangement of a square matrix of pixels shown in FIG. 5, an arrangement of hexagonal matrix of pixels can also be used to form the display panel 500.

In some applications, a fully programmable rectangular array of pixels is not necessary. Other designs of display panels with a variety of shapes and displays may also be formed using the device structures described herein. One class of examples is specialty applications, including signage and automotive. For example, multiple pixels may be arranged in the shape of a star or a spiral to form a display panel, and different patterns on the display panel can be produced by turning on and off the LEDs. Another specialty example is automobile headlights and smart lighting, where certain pixels are grouped together to form various illumination shapes and each group of LED pixels can be turned on or off or otherwise adjusted by individual pixel drivers.

Even the lateral arrangement of devices within each pixel can vary. In FIGS. 1, 2A, and 2B the LEDs and pixel drivers are arranged vertically, i.e., each LED is located on top of the corresponding pixel driver circuit. Other arrangements are possible. For example, the pixel drivers could also be located "behind", "in front of", or "beside" the LED.

Different types of display panels can be fabricated. For example, the resolution of a display panel can range typically from 8×8 to 3840×2160. Common display resolutions include QVGA with 320×240 resolution and an aspect ratio of 4:3, XGA with 1024×768 resolution and an aspect ratio of 4:3, D with 1280×720 resolution and an aspect ratio of 16:9, FHD with 1920×1080 resolution and an aspect ratio of 16:9, UHD with 3840×2160 resolution and an aspect ratio of 16:9, and 4K with 4096×2160 resolution. There can also be a wide variety of pixel sizes, ranging from sub-micron and below to 10 mm and above. The size of the overall display region can also vary widely, ranging from diagonals as small as tens of microns or less up to hundreds of inches or more.

Different applications will also have different requirements for optical brightness. Example applications include direct viewing display screens, light engines for home/office projectors and portable electronics such as smart phones, laptops, wearable electronics, AR and VR glasses, and retinal projections. The power consumption can vary from as low as a few milliwatts for retinal projectors to as high as kilowatts for large screen outdoor displays, projectors, and smart automobile headlights. In terms of frame rate, due to the fast response (nanoseconds) of inorganic LEDs, the frame rate can be as high as KHz, or even MHz for small resolutions.

Further embodiments also include various subsets of the above embodiments including embodiments in FIGS. 1, 2A, 2B, and 3-5 combined or otherwise re-arranged in various embodiments.

Although the detailed description contains many specifics, these should not be construed as limiting the scope of the invention but merely as illustrating different examples and aspects of the invention. It should be appreciated that the scope of the invention includes other embodiments not discussed in detail above. For example, the approaches described above can be applied to the integration of functional devices other than LEDs with control circuitry other than pixel drivers. Examples of non-LED devices include vertical cavity surface emitting lasers (VCSEL), photodetectors, micro-electro-mechanical system (MEMS), silicon photonic devices, power electronic devices, and distributed feedback lasers (DFB). Examples of other control circuitry include current drivers, voltage drivers, trans-impedance amplifiers, and logic circuits.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

Features of the present invention can be implemented in, using, or with the assistance of a computer program product, such as a storage medium (media) or computer readable storage medium (media) having instructions stored thereon/in which can be used to program a processing system to perform any of the features presented herein. The storage medium can include, but is not limited to, high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory optionally includes one or more storage devices remotely located from the CPU(s). Memory or alternatively the non-volatile memory device(s) within the memory, comprises a non-transitory computer readable storage medium.

Stored on any machine readable medium (media), features of the present invention can be incorporated in software and/or firmware for controlling the hardware of a processing system, and for enabling a processing system to interact with other mechanisms utilizing the results of the present invention. Such software or firmware may include, but is not limited to, application code, device drivers, operating systems, and execution environments/containers.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A single pixel multi-color micro light-emitting diode (LED) device for a display panel, comprising:
   a substrate supporting a pixel driver;
   a metal bonding layer on top of the substrate;
   a first LED structure layer on top of the metal bonding layer; and
   a second LED structure layer on top of the first LED structure layer;
   wherein:
      the first LED structure layer and the second LED structure layer substantially overlap laterally with one another to form a light path that combines light emitted from the first LED structure layer and light emitted from the second LED structure layer;
      a first-type electrode contacts a lower portion of the first LED structure layer, a lower portion of the second LED structure layer, and the metal bonding layer, respectively, and the first-type electrode electrically connects the pixel driver to the lower portion of the first LED structure layer and the lower portion of the second LED structure layer through the metal bonding layer; and
      a first second-type electrode is electrically connected to an upper portion of the first LED structure layer, and a second second-type electrode is electrically connected to an upper portion of the second LED structure layer.

2. The single pixel multi-color micro LED device according to claim 1, wherein the first-type electrode is a single continuous metal layer in direct contact with the lower portion of the first LED structure layer, the lower portion of the second LED structure layer, and the metal bonding layer, respectively.

3. The single pixel multi-color micro LED device according to claim 1, further comprising a first transparent bonding layer formed between the first LED structure layer and the second LED structure layer.

4. The single pixel multi-color micro LED device according to claim 3, wherein:
   the metal bonding layer is about 0.1 micron to about 3 microns; and
   the first transparent bonding layer is about 0.1 micron to about 5 microns.

5. The single pixel multi-color micro LED device according to claim 1, wherein the pixel driver comprises a thin-film transistor pixel driver or a silicon CMOS pixel driver.

6. The single pixel multi-color micro LED device according to claim 1, further comprising a third LED structure layer on top of the second LED structure layer, wherein:
   the third LED structure layer substantially overlaps laterally with the first LED structure layer and the second LED structure layer, and the light path further combines light emitted from the third LED structure layer;
   the first-type electrode further contacts a lower portion of the third LED structure layer and electrically connects the pixel driver to the lower portion of the third LED structure layer through the metal bonding layer; and
   a third second-type electrode is electrically connected to an upper portion of the third LED structure layer.

7. The single pixel multi-color micro LED device according to claim 6, wherein an insulation layer is deposited on a top surface of the third LED structure layer and side walls of the first LED structure layer, the second LED structure layer, and the third LED structure layer.

8. The single pixel multi-color micro LED device according to claim 7, wherein:
   the insulation layer comprises a plurality of holes that expose a plurality of contact points for the first-type electrode to contact and electrically connect to the lower portion of the first LED structure layer, the lower portion of the second LED structure layer, and the lower portion of the third LED structure layer; and
   a side wall of the metal bonding layer is exposed to contact and electrically connect to the first-type electrode.

9. The single pixel multi-color micro LED device according to claim 7, wherein:
   the insulation layer comprises a first hole that exposes a first contact point of the upper portion of the first LED structure layer, the first contact point contacting and electrically connecting to the first second-type electrode;
   the insulation layer comprises a second hole that exposes a second contact point of the upper portion of the second LED structure layer, the second contact point contacting and electrically connecting to the second second-type electrode; and
   the insulation layer comprises a third hole that exposes a third contact point of the upper portion of the third LED structure layer, the third contact point contacting and electrically connecting to the third second-type electrode.

10. The single pixel multi-color micro LED device according to claim 6, wherein each of the first LED structure layer, the second LED structure layer, and the third LED structure layer is selected from one or more structures from the group consisting of a III-V nitride epitaxial structure, a III-V arsenide epitaxial structure, a III-V phosphide epitaxial structure, and a III-V antimonide epitaxial structure.

11. The single pixel multi-color micro LED device according to claim 6, wherein each of the first-type electrode, the first second-type electrode, the second second-type electrode, and the third second-type electrode comprises one or more metals selected from the group consisting of aluminum, silver, rhodium, zinc, gold, germanium, nickel, chromium, platinum, tin, copper, tungsten, indium-tin-oxide, palladium, indium, and titanium.

12. The single pixel multi-color micro LED device according to claim 6, wherein the first LED structure layer, the second LED structure layer, and the third LED structure layer each produce light of different visible wavelengths.

13. The single pixel multi-color micro LED device according to claim 6, wherein:
the single pixel multi-color micro LED device has a cross-sectional shape of a pyramid that has a bottom layer with the longest lateral dimension and a top layer with the shortest lateral dimension; and
the longest lateral dimension is about 1 micron to about 500 microns.

14. The single pixel multi-color micro LED device according to claim 6, further comprising:
a first reflection layer between the substrate and the first LED structure layer;
a second reflection layer between the first LED structure layer and the second LED structure layer; and
a third reflection layer between the second LED structure layer and the third LED structure layer.

15. The single pixel multi-color micro LED device according to claim 14, wherein:
at least one of the first reflection layer, the second reflection layer, and the third reflection layer comprises a distributed Bragg reflector (DBR) structure; and
each of the first reflection layer, the second reflection layer, and the third reflection layer is about 0.1 micron to about 5 microns.

16. A micro light-emitting diode (LED) display chip, comprising:
a substrate supporting an array of pixel drivers; and
an array of single pixel multi-color micro LED devices, each single pixel multi-color micro LED device of the array of single pixel multi-color micro LED devices being electrically connected to a corresponding pixel driver of the array of pixel drivers,
wherein:
each single pixel multi-color micro LED device comprises a metal bonding layer on top of the substrate the corresponding pixel driver, a first LED structure layer on top of the metal bonding layer, and a second LED structure layer on top of the first LED structure layer;
within each single pixel multi-color micro LED device, the first LED structure layer and the second LED structure layer substantially overlap laterally with one another to form a light path that combines light emitted from the first LED structure layer and light emitted from the second LED structure layer;
within each single pixel multi-color micro LED device, a first-type electrode contacts a lower portion of the first LED structure layer, a lower portion of the second LED structure layer, and the metal bonding layer, respectively, and the first-type electrode electrically connects the corresponding pixel driver to the lower portion of the first LED structure layer and the lower portion of the second LED structure layer through the metal bonding layer; and
within each single pixel multi-color micro LED device, a first second-type electrode is electrically connected to an upper portion of the first LED structure layer, and a second second-type electrode is electrically connected to an upper portion of the second LED structure layer.

17. The micro LED display chip according to claim 16, wherein:
each single pixel multi-color micro LED device further comprises a third LED structure layer;
within each single pixel multi-color micro LED device, the third LED structure layer substantially overlaps laterally with the first LED structure layer and the second LED structure layer, and the light path further combines light emitted from the third LED structure layer;
within each single pixel multi-color micro LED device, the first-type electrode further contacts a lower portion of the third LED structure layer and electrically connects the corresponding pixel driver to the lower portion of the third LED structure layer through the metal bonding layer; and
within each single pixel multi-color micro LED device, a third second-type electrode is electrically connected to an upper portion of the third LED structure layer.

18. The micro LED display chip according to claim 17, wherein:
first second-type electrodes of single pixel multi-color micro LED devices of the array of single pixel multi-color micro LED devices are connected to a first common electrode;
second second-type electrodes of the single pixel multi-color micro LED devices are connected to a second common electrode; and
third second-type electrodes of the single pixel multi-color micro LED devices are connected to a third common electrode.

* * * * *